United States Patent
Murata et al.

(10) Patent No.: US 10,597,780 B2
(45) Date of Patent: Mar. 24, 2020

(54) SUBSTRATE PROCESSING APPARATUS, HEATER AND METHOD OF MANUFACTURING SEMICONDUCTOR DEVICE

(71) Applicant: Hitachi Kokusai Electric Inc., Tokyo (JP)

(72) Inventors: Hitoshi Murata, Toyama (JP); Takashi Yahata, Toyama (JP); Yuichi Wada, Toyama (JP); Takatomo Yamaguchi, Toyama (JP); Shuhei Saido, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 204 days.

(21) Appl. No.: 15/673,159

(22) Filed: Aug. 9, 2017

(65) Prior Publication Data

US 2017/0335458 A1    Nov. 23, 2017

Related U.S. Application Data

(63) Continuation of application No. PCT/JP2015/055366, filed on Feb. 25, 2015.

(51) Int. Cl.
*C23C 16/46* (2006.01)
*H01L 21/31* (2006.01)
(Continued)

(52) U.S. Cl.
CPC .......... *C23C 16/46* (2013.01); *H01L 21/0217* (2013.01); *H01L 21/0228* (2013.01);
(Continued)

(58) Field of Classification Search
CPC ................................................ H01L 21/67309
See application file for complete search history.

(56) References Cited

U.S. PATENT DOCUMENTS 6,372,048 B1    4/2002    Futamura et al.
2003/0183614 A1    10/2003    Yamaguchi et al.
(Continued)

FOREIGN PATENT DOCUMENTS

JP    11-001776 A    1/1999
JP    2002-043226    2/2002
(Continued)

OTHER PUBLICATIONS

Office Action in corresponding Japanese Patent Application No. 2017-501622, dated Nov. 7, 2017, with English translation.
(Continued)

*Primary Examiner* — Joseph A Miller, Jr.
(74) *Attorney, Agent, or Firm* — Edell, Shapiro & Finnan, LLC

(57) ABSTRACT

Described herein is a technique capable of reducing the time necessary for stabilizing the inner temperature of the processing furnace. A substrate processing apparatus may include: a wafer retainer configured to support a plurality of wafers; an upright cylindrical process vessel; a seal cap configured to cover an opening at a lower end of the process vessel; a first heater configured to heat an inside of the process vessel from a lateral side thereof; an insulating unit disposed between the seal cap and the wafer retainer; and a second heater facing at least one of the plurality of wafers and configured to heat the at least one of the plurality of wafers, the second heater including: a pillar penetrating centers of the seal cap and the insulating unit; an annular member connected to and concentric with the pillar; a pair of connecting parts connecting end portions of the annular member to the pillar; and a heating element disposed inside the annular member.

14 Claims, 11 Drawing Sheets

(51) Int. Cl.
*H01L 21/02* (2006.01)
*H01L 21/67* (2006.01)
*H01L 21/673* (2006.01)

(52) U.S. Cl.
CPC ........ *H01L 21/31* (2013.01); *H01L 21/67109* (2013.01); *H01L 21/67248* (2013.01); *H01L 21/67309* (2013.01)

(56) References Cited

U.S. PATENT DOCUMENTS

| | | | |
|---|---|---|---|
| 2005/0217799 A1 | 10/2005 | O'Meara et al. | |
| 2008/0023141 A1* | 1/2008 | Shimizu | C23C 16/4584 156/345.29 |
| 2011/0005686 A1 | 1/2011 | Tanaka et al. | |
| 2013/0042803 A1* | 2/2013 | Saido | C23C 16/45578 117/88 |
| 2015/0140835 A1* | 5/2015 | Tateno | C23C 16/52 438/773 |

FOREIGN PATENT DOCUMENTS

| | | |
|---|---|---|
| JP | 2003-282578 A | 10/2003 |
| JP | 2004-288744 A | 10/2004 |
| JP | 2007-537582 A | 12/2007 |
| JP | 2010-109316 A | 5/2010 |
| WO | WO2014/021220 * | 2/2014 |

OTHER PUBLICATIONS

International Search Report in corresponding PACT Application No. PCT/JP2015/055366, dated May 19, 2015, with English translation.

* cited by examiner

SUBSTRATE PROCESSING APPARATUS, HEATER AND METHOD OF MANUFACTURING SEMICONDUCTOR DEVICE

CROSS REFERENCE TO RELATED APPLICATIONS

This application is a continuation of International Application No. PCT/JP2015/055366, filed on Feb. 25, 2015, in the WIPO, the entire contents of which are hereby incorporated by reference.

TECHNICAL FIELD

The present disclosure relates to a substrate processing apparatus, a heater and a method of manufacturing a semiconductor device.

BACKGROUND

A substrate processing apparatus such as a vertical type substrate processing apparatus is used for heat treatment of a substrate in a process of manufacturing a semiconductor device. A predetermined number of substrates (wafers) are arranged in a vertical direction and supported by a substrate retainer of the vertical the substrate processing apparatus. The substrate retainer is loaded into a process chamber of the vertical type substrate processing apparatus. Then, as a process gas is introduced into the process chamber with the substrate heated by a side heater which is provided outside the process chamber, substrate processing such as the heat treatment is performed.

The vertical type substrate processing apparatus may be include a surface type sub-heater for auxiliary heating disposed at a lower portion of a process chamber as well as a side heater. The surface type sub-heater reduces the time necessary for recovering and maintaining the temperature of the entire process chamber to shorten the processing time of the substrate.

On the other hand, when the diameter of the wafer is large, it is difficult to heat the center portion of the wafer. Therefore, it takes a long time to raise the temperature of the center portion of the lowermost wafer in the process chamber. Since the peripheral portion of the wafer is heated by both the side heater and the sub-heater with the conventional sub-heater, the temperature gradient profile of the lower portion of the process chamber during the raising of the temperature of the process chamber is different from the temperature gradient profile of the process chamber stabilized at a preset temperature, and the thermal velocity in the lower part of the process chamber stabilized at the preset temperature is different from the thermal velocity in the lower part of the process chamber without the sub-heater. Therefore, in the process of raising the temperature of the process chamber, the temperature distribution among a plurality of substrates and the temperature distribution at the surface of the substrate are not uniform. As a result, the recovery (temperature stabilization) may take longer.

SUMMARY

Described herein is a technique capable of reducing the time necessary for stabilizing the inner temperature of the processing furnace.

According to one aspect of the technique described herein, a substrate processing apparatus may include: a wafer retainer configured to support a plurality of wafers; an upright cylindrical process vessel where the plurality of wafers supported by the wafer retainer is processed; a seal cap configured to cover an opening at a lower end of the process vessel; a first heater configured to heat an inside of the process vessel from a lateral side thereof; an insulating unit disposed between the seal cap and the wafer retainer in the process vessel; and a second heater facing at least one of the plurality of wafers supported by the wafer retainer disposed above the insulating unit, wherein the second heater is configured to heat the at least one of the plurality of wafers, the second heater including: a pillar penetrating centers of the seal cap and the insulating unit; an annular member connected to and concentric with the pillar; a pair of connecting parts connecting end portions of the annular member to the pillar; and a heating element disposed inside the annular member.

DETAILED DESCRIPTION

An embodiment will be described with reference to FIGS. 1 through 3.

Embodiment

Figure 1:
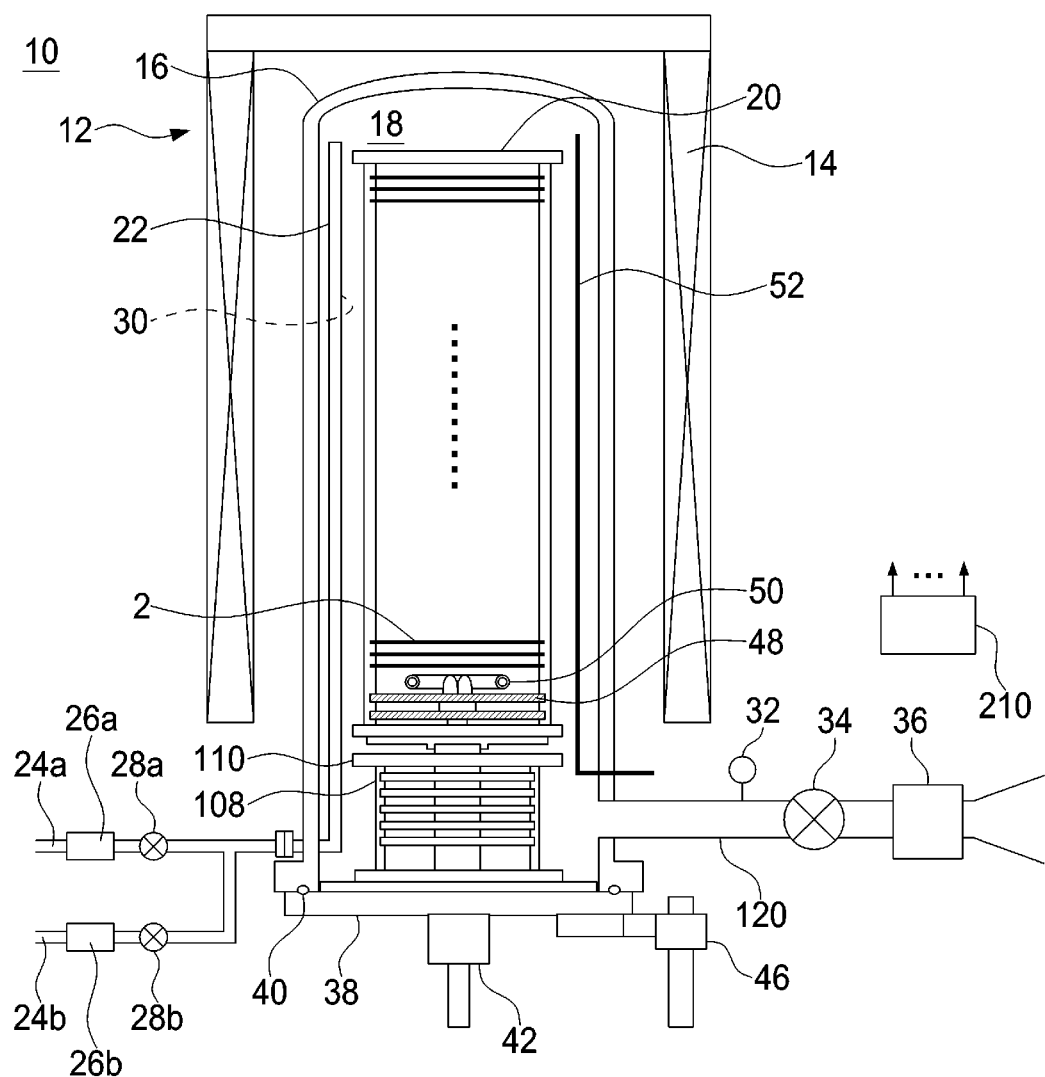
FIG. 1 is a vertical cross-sectional view schematically illustrating a vertical type processing furnace of a substrate processing apparatus according to an embodiment.

As illustrated in FIG. 1, a substrate processing apparatus according to the embodiment is a vertical type heat treatment apparatus 4 (batch type heat treatment apparatus) in which a heat treatment process according to a manufacturing method of an integrated circuit (IC) is performed. A processing furnace 12 includes a cylindrical heater 14 serving as a heating means (heating unit). The heater 14 is vertically supported by a heater base (not shown). The inside of the heater 14 is divided into multiple regions. The regions may be individually heated to different temperatures by controlling the electrical power supplied to the heater 14. As described below, the heater 14 may operate as an activation mechanism (excitation unit) for activating (exciting) a gas by heat.

A reaction tube 16 constituting a reaction vessel (process vessel) is provided in upright manner inside the heater 14 concentrically with the heater 14. The reaction tube 16 is made of heat-and-corrosion-resistant materials such as high purity quartz ($SiO_2$) and silicon carbide (SiC) and is cylindrical with a closed upper end and an open lower end. A process chamber 18 is provided in a hollow portion of the reaction tube 16. The process chamber 18 accommodates a wafer (substrate) 2 horizontally retained in a boat 20 which is to be described later, in multiple vertical stages.

The nozzle 22 is provided in an annular space between the inner wall of the reaction tube 16 and the wafer 2. For example, the nozzle 22 is an L-shaped tube having a short horizontal portion and a long vertical portion. The horizontal portion penetrates the sidewall of the lower portion of the reaction tube 16. The vertical portion extends from the lower end of a wafer arrangement region where the wafer 2 is arranged toward the upper end of the wafer arrangement region. The vertical portion of the nozzle 22 is made of a heat-resistant material such as quartz and SiC. A plurality of gas supply ports 30 for injecting gas are provided on the side surface of the nozzle 22. The vertical portion is disposed along the wafer arrangement region in an area on the lateral side of the wafer arrangement region, i.e., a space horizontally surrounding the wafer arrangement region. The gas supply ports 30 are open toward the center of the reaction tube 16 at predetermined intervals from the lower portion to the upper portion thereof to uniformly supply the gas toward the wafer 2. For example, the gas supply ports 30 may each have substantially the same opening area, and may be provided at the same pitch as the spacing of the wafers to force the convection of the gas in the gap between the wafers 2.

A gas supply pipe 24a is connected to the horizontal portion of the nozzle 22. A mass flow rate controller (MFC) 26a, which is a flow rate controller (flow rate control unit), and a valve 28a, which is an on/off valve, are connected to the gas supply pipe 24a in order from the upstream side to the downstream side of the gas supply pipe 24a. A gas supply pipe 24b which supplies an inert gas is connected to a downstream side of the valve 28a of the gas supply pipe 24a. A mass flow rate controller (MFC) 26b and a valve 28b are connected to the gas supply pipe 24b in order from the upstream side to the downstream side of the gas supply pipe 24b. A process gas supply unit serving as a process gas supply system includes the gas supply pipe 24a, the MFC 26a and the valve 28a.

However, the processing furnace 12 according to embodiment is not limited to the above-described structure. For example, a plurality of nozzles may be provided. A metal opening (not shown) having a diameter substantially equal to that of the reaction tube 16 may be provided under the reaction tube 16. The plurality of nozzles may be provided to penetrate sidewall of the manifold. An exhaust pipe 120, which will be described later, may be provided at a lower portion or at the manifold of the reaction tube 16. The manifold of the processing furnace 12 may be made of metal. The nozzle may be provided at the metal manifold.

The exhaust pipe 120 for exhausting the inner atmosphere of the process chamber 18 is installed at the reaction tube 16. A vacuum pump 36 serving as a vacuum exhauster is connected to the exhaust pipe 120 through a pressure sensor 32 and an APC (Automatic Pressure Controller) valve 34.

The pressure sensor 32 serves as a pressure detector (pressure detecting unit) to detect the inner pressure of the process chamber 18, and the APC valve 34 serves as a pressure controller (pressure control unit). With the vacuum pump 36 in operation, the APC valve 34 may be opened/closed to vacuum-exhaust the process chamber 18 or stop the vacuum exhaust. With the vacuum pump 36 in operation, the opening degree of the APC valve 34 may be adjusted based on the pressure detected by the pressure sensor 32, in order to control the inner pressure of the process chamber 18. An exhaust system includes the exhaust pipe 120, the APC valve 34 and the pressure sensor 32. The exhaust system may further include the vacuum pump 36.

Figure 2:
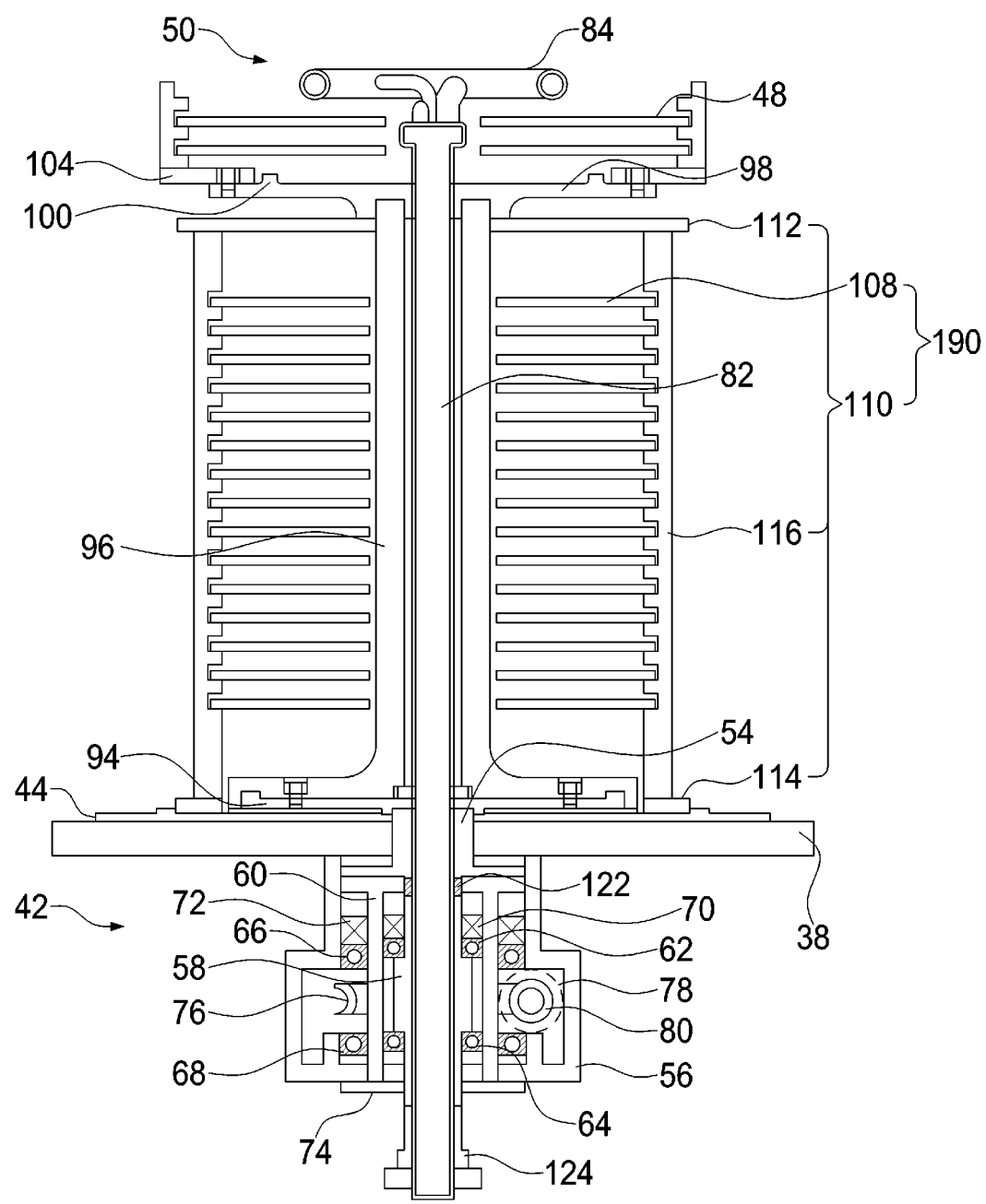
FIG. 2 is a vertical cross-sectional view schematically illustrating a sub-heater of the substrate processing apparatus and peripherals thereof according to the embodiment.

As shown in FIG. 2, a seal cap 38 serving as a furnace opening cover capable of sealing the lower end opening of the reaction tube 16 in airtight manner is provided under the reaction tube 16. The seal cap 38 is made of metal such as stainless steel (SUS) and nickel alloy, and is disk-shaped. The O-ring 40 serving as a sealing member is provided on the upper surface of the seal cap 38 so as to be in contact with the lower end of the reaction tube 16. A seal cap plate 44 protecting the seal cap 38 is mounted on the upper surface of the seal cap 38 inner than the O-ring 40. The seal cap plate 44 is made of a heat-and-corrosion-resistant material such as quartz and SiC, and is disk-shaped.

The seal cap 38 is in contact with the lower end of the reaction tube 16. The seal cap 38 may be moved upward/downward in the vertical direction by a boat elevator 46 installed outside the reaction tube 16 and serving as an elevating mechanism. That is, by moving the seal cap 219 upward and downward by the boat elevator 46, the boat 20 may be loaded into the process chamber 18 or unloaded from the process chamber 18 by the boat elevator 46. That is, the boat elevator 46 serves as a transfer device (transfer mechanism) (not shown) that loads the boat 20 (the wafer 2) into the process chamber 18 or unloads the boat 20 (the wafer 2) from the process chamber 18.

The boat 20 serving as a substrate retainer supports concentrically arranged plurality of wafers 20 (for example, 25 to 200 wafers) in horizontal orientation in multiple stages. The boat 20 is made of a heat-and-corrosion-resistant material such as high purity quartz and SiC. A space in which a sub-heater 50 (cap heater) to be described later is disposed is provided below the lowermost wafer 2 among the plurality of wafers 2 placed on the boat 20. For example, two or more circular first heat insulating plates 48 having a diameter substantially equal to that of the wafer 2 are supported in multiple stages in a horizontal orientation under the sub-heater 50. The first heat insulating plate 48 is made of a material having a small heat capacity and a high emissivity. For example, the first heat insulating plate 48 may be made of materials such as silicon, opaque quartz, SiC and $Si_3C_4$. For example, one surface of the first heat insulating plate 48 made of silicon may be polished. The polished surface of the first heat insulating plate 48 made of silicon may be the upper surface (the surface facing the sub-heater 50) thereof. The distance between the insulating plates 48 may be greater than the distance between the wafers 2 charged in the boat 20 to facilitate the absorption of the heat radiated from the sub-heater 50 by the heat insulating plates 48. As a result, the temperature response of the wafer 2 may be improved, and the recovery time can be shortened when temperature recovery is performed.

A temperature detecting unit 52 serving as a temperature detector is installed in the reaction tube 16. The temperature detecting unit 52 includes a plurality of thermocouples extending vertically, and the energization state of the heater 14 is controlled based on the temperature detected by the temperature detecting unit 52 such that the inner temperature of the process chamber 18 has a desired temperature distribution. The temperature detecting unit 52 is L-shaped similar to the nozzles 22, and provided along the inner wall of the reaction tube 16.

As shown in FIG. 2, a boat rotating mechanism 42 for rotating the boat 20 is provided on the lower surface (opposite to the process chamber 18) of the seal cap 38. The boat rotating mechanism 42 includes a housing 56 which is substantially cylindrical with an open upper end and a closed lower end. The housing 56 is disposed and secured concentrically below the seal cap 38. An inner shaft 58, which has an elongated cylindrical shape, is vertically disposed inside the housing 56 and is fixedly supported on the housing 56. An outer shaft 60 is disposed concentrically outside the inner shaft 58. The outer shaft 60 is cylindrical and has a diameter larger than the outer diameter of the inner shaft 58. A joint (not shown) has a hole at the center thereof into which the sub-heater 50 is inserted, and is provided at the upper end of the outer shaft 60. The outer shaft 60 is rotatably supported by an upper inner bearing 62 and a lower inner bearing 64 provided between the outer shaft 60 and the inner shaft 58 and an upper outer bearing 66 and a lower outer bearing 68 provided between the outer shaft 60 and the housing 56.

An inner magnetic fluid seal 70 is provided on the upper inner bearing 62. An outer magnetic fluid seal 72 is mounted on the upper outer bearing 66. A cap 74 for sealing the lower end of the outer shaft 58 is fixed to the lower surface of the housing 56. A worm wheel 76 is concentrically fixed to the outer shaft 60 between the upper outer bearing 66 and the lower outer bearing 68. A worm screw 80, which is rotated by an electric motor 78, is engaged with the worm wheel 76.

The sub-heater 50 is a heater for heating the wafer 2 through the back surface thereof in the process chamber 18, and is inserted vertically into the inner shaft 58. The sub-heater 50 includes a vertically extending pillar 82 and a heating part 84 horizontally disposed at an upper end of the pillar 82. The outer diameter of the pillar 82 is slightly narrowed downward from the top of the inner shaft 58. The pillar 82 is engaged with and supported by a support 122 made of heat-resistant resin. A lower end of the pillar 82 is sealed by a support 124, which is a vacuum joint, via an O-ring at a position lower than the lower surface of the housing 56.

Figure 9:
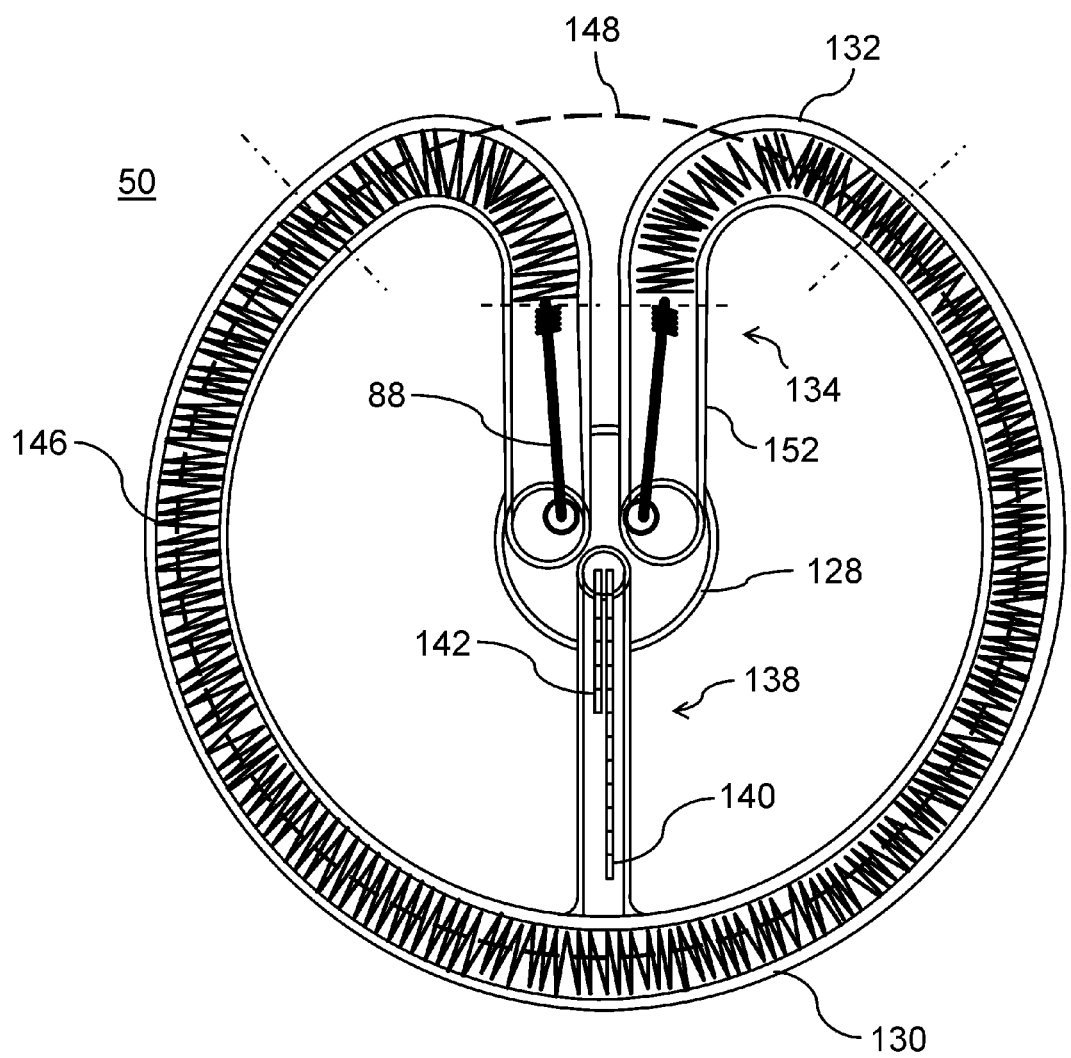
FIG. 9 is a top view of the sub-heater of the substrate processing apparatus according to the embodiment.

As shown in FIG. 9, the heating part 84 is substantially annular. The outer diameter of the heating part 84 is slightly smaller than the diameter of the wafer 2. The heating part 84 is disposed to be parallel to the wafer 2 and concentric with the wafer 2 or the reaction tube 16. The heating part 84 directly faces the lowermost wafer 2 such that the radiant heat from the heating part 84 is directly conducted to the wafer 2. The lowermost wafer 2 is not limited to a product wafer that is eventually processed into an IC. For example, the lowermost wafer 2 may be a dummy wafer for satisfying processing conditions. Dummy wafers are the same as product wafers and are prepared in place of product wafers except that commercial quality is not required. The substrate processing apparatus 10 is generally configured to process the entire wafer including the dummy wafer under the same process conditions. A resistive heating element 146, which is constituted by a coiled resistive wire, is inserted in the heating part 84. The resistive heating element 146 is made of, for example, a material such as Fe—Cr—Al alloy and molybdenum disilicide. As shown in FIG. 9, two ends of the resistive heating element 146 are connected to lead wires 88 at the connection point of the pillar 82 and the heating part 84. The lead wire 88 is bent in a vertically downward direction and inserted into the pillar 82. The heat capacity of the heating part 84 may be 1 kW or less or ¹⁄₁₀ or less of the heat capacity of the heater 14.

A rotating shaft 54 is substantially cylindrical and fixed to the upper surface of the outer shaft 60. The rotating shaft 54 has an outer flange at the lower end thereof and a through-hole at the center thereof for passing the sub-heater 50 therethrough. A base support 94 is fixed to the upper end of the rotating shaft 54 and is disc-shaped. The base support 94 has a through-hole at the center thereof that passes the sub-heater 50 therethrough. The base support 94 is made of a metal such as stainless steel. A boat base 96 is substantially cylindrical and is fixed to the upper surface of the base support 94. The boat base 96 has an outer flange having an outer diameter slightly greater than that of the base support 94 at the lower end thereof. The boat base 96 has a through-hole at the center thereof for passing the sub-heater 50 therethrough. The boat base 96 is made of a heat-resistant material such as quartz and SiC. The boat base 96 is fixed, for example, by a quartz bolt. Since the surface of the base support 94 is covered by the boat base 96, the corrosion of the base support 94 by the process gas may be prevented. The connecting portion of the boat base 96 whereat the flange and the cylindrical portion are connected is preferably curved in order to suppress the concentration of stress at the connecting portion and to increase the strength of the boat base 96. The curved smooth connecting portion prevents facilitates the flow of the process gas and prevents the retention of the process gas at the connecting portion.

The boat plate 98 is disk-shaped and fixed to the upper end of the boat base 96. The boat plate 98 has a through-hole at the center thereof for passing the sub-heater 50 therethrough. A position guiding protrusion 100 protrudes from the upper surface of the boat plate 98 and is disposed concentrically with the boat plate 98. The boat 20 is fixed to the upper surface of the boat plate 98. The boat 20 includes: a disk-shaped upper plate 102; an annular lower plate 104 having an outer diameter equal to the diameter the upper plate 102 and an inner diameter greater than both of outer diameters of the position guiding protrusion 100 and the heating part 84; and a plurality of support columns 106 connecting the upper plate 102 and the lower plate 104. The position of the boat 20 is determined by the position guiding protrusion 100 and the inner diameter of the lower plate 104.

An insulator support 110 supports stacked second heat insulating plates 108, and is fixed to the upper surface of the seal cap 38. The insulator support 110 includes: a disk-shaped upper plate 112 having a through-hole at the center thereof for passing the boat base 96 therethrough; an annular lower plate 114 having an outer diameter and an inner diameter the same as that of the upper plate 112 and greater than that of the boat base 96, respectively; and a plurality of support columns 116 connecting the upper plate 112 and the lower plate 114. A plurality of support recesses are engraved at each of the plurality of support columns 116 at predetermined intervals in lengthwise direction of each of the plurality of support columns 116 to face one another. The second heat insulating plates 108 made of, for example, quartz, and having a smaller outer diameter than the outer diameter of the wafer 2, are inserted into the plurality of support recesses, and each of the second heat insulating plates 108 is concentrically arranged at horizontal orientation. Preferably, a material having a high reflectivity (low emissivity) is used as the second heat insulating plates 108.

Transparent quartz, sapphire, ceramics and a refractory metal such as tantalum may be used as the second heat insulating plate 108.

A notch 118 is provided in the radial direction of the second heat insulating plate 108. The notch 118 is slightly wider than the cylindrical part of the boat base 96 to pass through. The notch 118 is longer than the radius of the second heat insulating plate 108 by the width thereof. The notches 118 are misaligned from one another such that the notches 118 do not overlap with one another when the second heat insulating plates 108 are inserted in the plurality of support recesses. By misaligning the notches 118 of the second heat insulating plates 108, adverse effects of the notch 56 of each second heat insulating plate 108 may be reduced. The second heat insulating plate 108 and the insulator support 110 constitute the insulating unit 190. The insulating unit 190 is separated from the boat 20 and boat base 96 respectively with sufficient clearances.

The first heat insulating plate 48 provided in the lowermost region of the boat 20 also has a notch 144 in the radial direction of the first heat insulating plate 48 similar to the second heat insulating plate 108. The notch 144 is slightly wider than the outer diameter of the pillar 82 and narrower than the width of the notch 118 of the second heat insulating plate 108 for the pillar 82 of the sub-heater 50 to pass through. The heat capacity of the first heat insulating plate 48 is larger than that of the second heat insulating plate 108 such that the first heat insulating plate 48 efficiently absorbs the radiant heat from the sub-heater 50 as compared to the second heat insulating plate 108 to shorten the recovery time.

Above-described structure allows the rotation of the boat 20 without rotating the second heat insulating plate 108 and the sub-heater 50.

Figure 3:
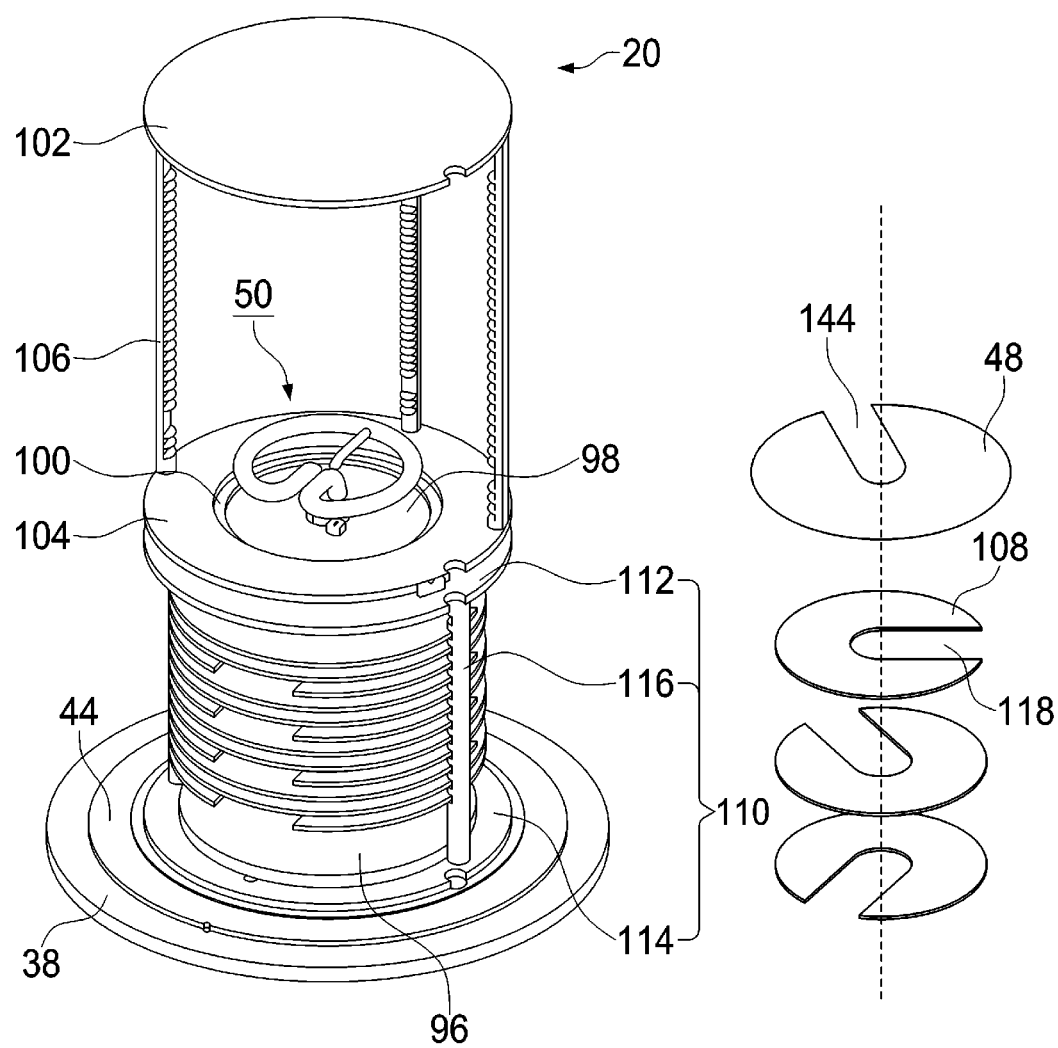
FIG. 3 is a perspective view schematically illustrating a sub-heater of the substrate processing apparatus and peripherals thereof according to the embodiment.
Figure 4:
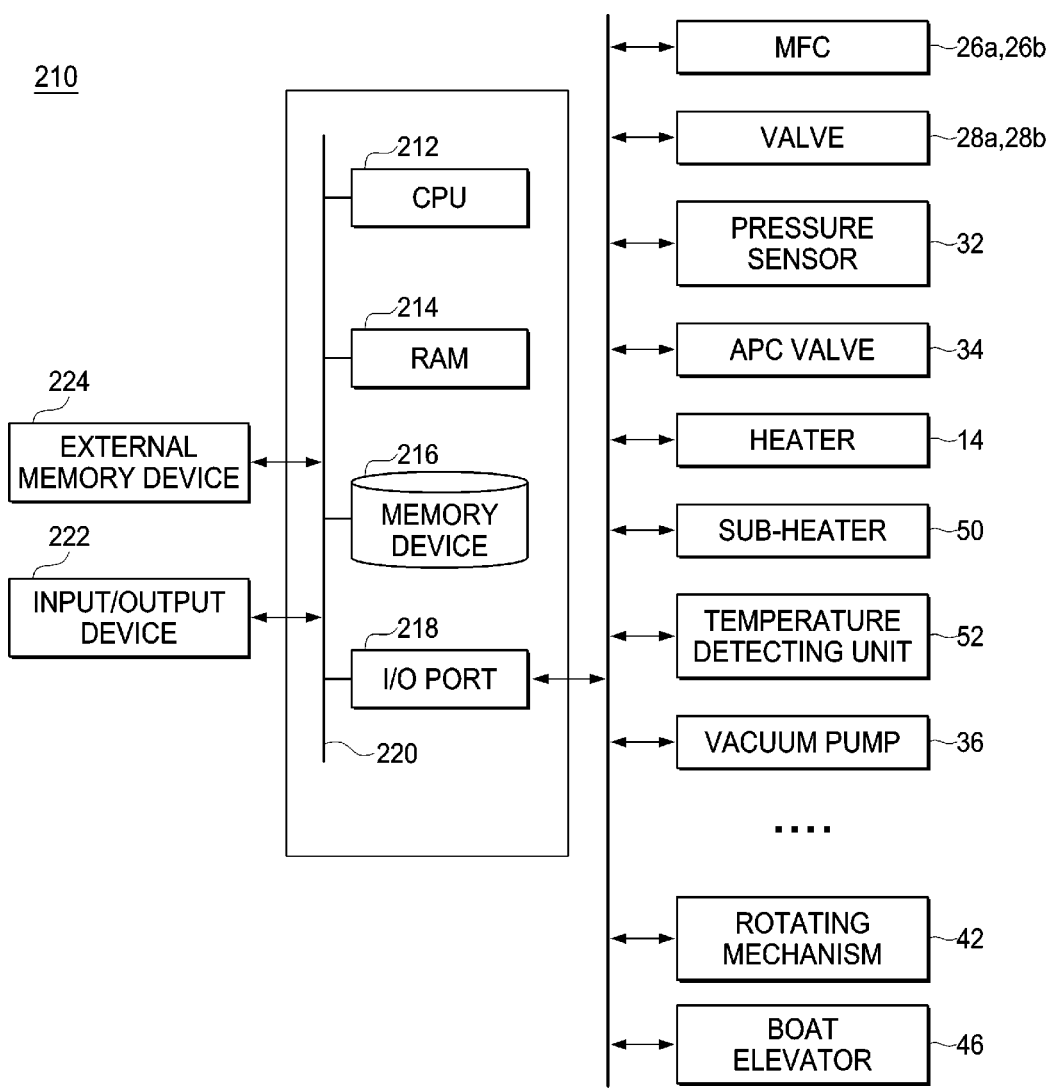
FIG. 4 is a block diagram illustrating a controller of the substrate processing apparatus and peripherals thereof controlled by the controller according to the embodiment.

As shown in FIG. 3, a controller 210, which is a control unit, may be embodied by an industrial computer having a CPU (Central Processing Unit) 212, a RAM (Random Access Memory) 214, a memory device 216 and an I/O port 218. The RAM 214, the memory device 216 and the I/O port 218 may exchange data with the CPU 212 via an internal bus 220. An input/output device 222 such as a touch panel may be connected to the controller 210.

The memory device 216 may be embodied by components such as flash memory and HDD (Hard Disk Drive). A control program for controlling the operation of the substrate processing apparatus and a program recipe in which information such as the order and condition of the substrate processing is stored are readably stored in the memory device 216. A process recipe is a program that is executed in the controller 210 to obtain a predetermined result by performing sequences of the substrate processing. Hereinafter, the process recipe and the control program are collectively referred to simply as a program. The term "program" may refer to only the process recipe, only the control program, or both. The RAM 2814 is a work area in which the program or the data read by the CPU 212 are temporarily stored.

The I/O port 218 is an interface conforming to standards such as RS-485 and EtherCAT. The I/O port 218 is connected to the components such as the MFCs 26a and 26b, the valves 28a and 28b, the pressure sensor 32, the APC valve 34, the vacuum pump 36, the heater 14, the sub-heater 50, the temperature detecting unit 52, the rotating mechanism 42 and the boat elevator 46.

The CPU 212 is configured to read and execute the control program stored in the memory device 216, and read the process recipe in accordance with an instruction such as an operation command inputted from the input/output device 222. The CPU 212 may be configured to perform operations such as flow rate adjusting operations of the MFCs 26a and 26b, opening and closing operations of the valves 28a and 28b, pressure adjusting operations of the APC valve 34 based on the pressure sensor 32 and opening and closing of the APC valve 34, an ON/OFF control of the vacuum pump 36, temperature adjusting operations of the heater 14 and the sub-heater 50 based on temperature detected by the temperature detecting unit 52, rotating and rotating speed adjusting operations of the boat 20 by the rotating mechanism 42, and lifting operations of the boat 20 by the elevating mechanism 218.

The controller 210 of the embodiment may be embodied by preparing the external memory device 224 (e.g. magnetic tapes, magnetic disks such as flexible disk and hard disk, optical disks such as CD and DVD, magneto-optical disks such as MO, and semiconductor memories such as USB memory and memory card) and installing the program on the computer using the external memory device 224. The memory device 216 or the external memory device 224 may be embodied by a computer-readable recording medium. Hereinafter, the memory device 216 or the external memory device 224 may be collectively referred to as recording medium. Hereinafter, the term "recording medium" may refer to only the memory device 216, only the external memory device 224, or both. The method of providing the program to the computer is not limited to the external memory device 224. The program may be directly provided to the computer using a communication means such as a network (Internet or dedicated line) without the external memory device 224.

Next, an exemplary sequence of forming a film on a substrate, which is one of manufacturing processes of a semiconductor device, using the substrate processing apparatus 10 will be described. Hereinafter, an exemplary film-forming process, wherein the film is formed on the wafer (substrate) 2 by alternately supplying a first process gas (source gas) and a second process gas (reactive gas) to the wafer 2, will be described.

Hereinafter, an example of forming a silicon nitride film ($Si_3N_4$ film, hereinafter simply referred to as SiN film) on the wafer 2 by supplying to the wafer 2 hexachlorodisilane ($Si_2Cl_6$, abbreviated as HCDS) gas serving as the source gas and ammonia ($NH_3$) gas serving as the reactive gas will be described. Hereinafter, the controller 210 controls the operation of the components constituting the substrate processing apparatus 10.

In the film-forming processing in the embodiment, the SiN film is formed on the wafer 2 by performing a cycle a predetermined number of times (once or more). The cycle may include a step of supplying HCDS gas onto the wafer 2 in the process chamber 18, a step of removing the HCDS gas (residual gas) from the process chamber 18, a step of supplying $NH_3$ gas onto the wafer 2 in the process chamber 18 and a step of removing the $NH_3$ gas (residual gas) from the process chamber 18. The steps in the cycle are performed non-simultaneously.

Hereinafter, the above-described film-forming sequence according to the embodiment may be represented as follows: arrow indicates the transition of the steps; and "n" indicates the number of times the steps are performed. The arrow and "n" represent the same in modified examples and other embodiments.

$$(HCDS \rightarrow NH_3) \times n \Rightarrow SiN$$

In the specification, the term "wafer" refers to "wafer itself" or "stacked structure of wafer and layer or film formed on the surface thereof" (collectively to "the wafer and the layer or the film formed on the surface thereof"). "Surface of wafer" may be refers to "surface of wafer itself" or "surface of layer or film formed on the surface of wafer" (i.e. "top surface of the stacked structure").

Thus, in the specification, "supplying a predetermined gas to a wafer" refers to "supplying a predetermined gas directly to a surface (exposed surface) of the wafer itself" or "supplying a predetermined gas to a layer or film formed on a wafer" (i.e. "supplying a predetermined gas to the top surface of the stacked structure"). In the specification, "forming a predetermined layer (or film) on a wafer" refers to "forming a predetermined layer (or film) directly on the surface (exposed surface) of the wafer itself" or "forming a predetermined layer (or film) on the stacked structure" ((i.e. "forming a predetermined layer (or film) on the top surface of the stacked structure").

The term "substrate" is used in the same sense as "wafer" in the specification, and the term "wafer" may be substituted by "substrate."

Wafer Charging and Boat Loading Step S201

The plurality of wafers 2 are charged into the boat 20 (wafer charging) and the boat 20 is loaded into the process chamber 18 by the boat elevator 46 (boat loading), and the seal cap 38 then air-tightly seals the lower end of the reaction 16 via the O-ring 40.

Pressure and Temperature Adjusting Step S202

The inside of the process chamber 18, that is, the space in which the wafer 2 is present, is vacuum-exhausted (depressurized and exhausted) by the vacuum pump 36 until the inner pressure of the process chamber 18 a predetermined pressure (vacuum level). At this time, the inner pressure of the process chamber 18 is measured by the pressure sensor 34 and the APC valve 34 is feedback-controlled based on the pressure measured by the pressure sensor 34. The vacuum pump 36 is continuously operated at least until the processing of the wafer 2 is completed.

The inside of the process chamber 18 is heated by the heater 14 and the sub-heater 50 until the temperature of the wafer 2 inside the process chamber 18 reaches a predetermined temperature. At this time, the energization state of the heater 14 is feedback-controlled based on the temperature detected by the temperature detecting unit 52 until the inner temperature of the process chamber 18 has a predetermined temperature distribution. The energization state of the sub-heater 50 is feedback-controlled based on the temperature detected by the temperature detecting unit 138. The heater 14 and the sub-heater 50 continuously heat the inside of the process chamber 18 at least until the processing of the wafer 2 is completed. In order to compensate for the leakage of heat through the furnace opening, the heater 14 heats the lowermost region the most, and the temperature of the first heat insulating plate 48 absorbing the heat is slightly higher than the temperature of the wafer arrangement region. The heating by the sub-heater 50 may be suspended if necessary. That is, the wafer 2 in the process chamber 18 may be heated by only the heater 14.

Simultaneously, the boat 20 and the wafer 2 are rotated by the rotation mechanism 42. As the rotation mechanism 42 rotates the boat 20 via the base support 94, the boat base 96, the boat plate 98 and the lower plate 104, the wafer 2 is rotated without rotating the second heat insulating plate 108 and sub-heater 64. The rotation mechanism 42 continuously rotates the boat 20 and the wafer 2 at least until the processing of the wafer 2 is completed.

Film-forming Step S301

When the inner temperature of the process chamber 18 is stabilized at a preset processing temperature, a first step S203 and a second step S204 are sequentially performed. Before performing the steps S203 and S204, a pre-processing for forming sites such as an H-terminated site or an OH-terminated site to which HCDS is likely to be chemisorbed (including dissociative adsorption) on the surface of the wafer 2 may be performed. In addition, the second step S204 may be performed once before performing the first step S203. The pre-processing may include, for example, a hydrogen plasma treatment and an ultraviolet irradiation treatment.

First Step S203

In the first step S203, HCDS gas is supplied onto the wafer 2 in the process chamber 18.

The HCDS gas is supplied into the gas supply pipe 24a by opening the valve 28a. The flow rate of the HCDS gas is adjusted by the MFC 26a, and the HCDS gas with the flow rate thereof adjusted is supplied into the process chamber 18 through the nozzle 22 to supply HCDS gas onto the wafer 2, and is exhausted through the exhaust pipe 120. Simultaneously, $N_2$ gas is supplied into the gas supply pipe 24b by opening the valve 28b. The flow rate of the $N_2$ gas is adjusted by the MFC 26b, and the $N_2$ gas with the flow rate thereof adjusted is supplied into the process chamber 18 along with the HCDS gas and is exhausted through the exhaust pipe 120. A silicon (Si)-containing layer serving as a first layer having a thickness ranging from, for example, less than one atomic layer to several atomic layers is formed on a top surface of the wafer 2. One of the purposes of supplying $N_2$ gas is to uniformly expose the wafer 2 to HCDS gas.

After the first layer is formed, the supply of the HCDS gas is stopped by closing the valve 28a. At this time, unreacted gas or the HCDS gas that has contributed to formation of the first layer and remaining in the process chamber 18 is exhausted from the process chamber 18 by vacuum-exhausting the inside of the process chamber 18 using the vacuum pump 36 with the APC valve 34 open. Simultaneously, the $N_2$ gas is continuously supplied into the process chamber 18 while maintaining the valve 28b open. The $N_2$ gas serves as a purge gas, and thus the exhaust of the residual gas from the process chamber 18 is effectively performed by the $N_2$ gas.

At this time, it is not necessary to completely discharge the gas remaining in the process chamber 18 and completely purge the process chamber 18. A small amount of gas remaining in the process chamber 18 does not adversely affect the subsequent second step. It is not necessary to supply the N2 gas at a large flow rate into the process chamber 18. The purge may be performed by supplying the N2 gas of an amount equal to the volume of the reaction tube 16 (process chamber 18) such that the second step will not be adversely affected. By not completely purging the inside of the process chamber 18, the purging time may be shortened and the throughput may be improved. The consumption of the N2 gas is suppressed to the minimum.

Second Step S204

After the first step S203 is completed, $NH_3$ gas is supplied onto the wafer 2, i.e. onto the first layer formed on the wafer 2 in the process chamber 18 in the second step S204 by thermally activating the $NH_3$ gas.

In the second step S204, the valves 28a and 28b are controlled in the same manner as in the first step S203. The flow rate of the $NH_3$ gas is adjusted by the MFC 28a, and the $NH_3$ gas with the flow rate thereof adjusted is supplied into the process chamber 18 through the nozzle 22 to be supplied onto the wafer 2 and are exhausted through the exhaust pipe 120. The NH$_3$ gas supplied onto the wafer 2 reacts with the first layer, i.e. at least a portion of the silicon-containing layer formed on the wafer 2 in the first step S203. As a result, the first layer is thermally nitrided under non-plasma atmosphere and modified into a second layer including silicon (Si) and nitrogen (N), namely, a silicon nitride (SiN) layer. In case that a silicon layer having H-terminated sites is formed in the first step S203, the NH$_3$ gas is dissociatively adsorbed to the silicon layer to form NH$_2$-terminated or NH-terminated surface. Alternately, the NH$_3$ gas may be plasma-excited and then supplied to the wafer 2 to nitride (modify) the first layer under plasma atmosphere into the second (SiN) layer.

After the second layer is formed, the supply of the NH$_3$ gas is stopped by closing the valve 28a. An unreacted gas, the NH$_3$ gas that has contributed to formation of the second layer or reaction by-products remaining in the process chamber 18 is exhausted from the process chamber 18 in the same manner as the first step S203. Similar to the first step S203, it is not necessary to completely discharge the gases remaining in the process chamber 18.

Determination Step S205

A cycle including the non-simultaneously performed steps S203 and S204 are performed a predetermined number of times (n times) until an SiN film having a predetermined composition and a predetermined thickness is formed on the wafer 2. That is, in the determination step, it is determined whether the cycle is performed n times. It is preferable that the cycle is performed multiple times. It is preferable that the cycle is repeated until the second (SiN) layer having the predetermined thickness is obtained by controlling the second (SiN) layer formed in each cycle to be thinner than the second (SiN) layer having the predetermined thickness and stacking the thin second (SiN) layer by repeating the cycle.

Processing conditions of the sequence include, for example, a processing temperature (wafer temperature) ranging from 250° C. to 700° C., a processing pressure (the inner pressure of the process chamber) ranging from 1 Pa to 4,000 Pa, a flow rate of HCDS gas ranging from 1 sccm to 2,000 sccm, a flow rate of NH$_3$ gas ranging from 100 sccm to 10,000 sccm and a flow rate of N$_2$ gas ranging from 100 sccm to 10,000 sccm. The film-forming processing S301 may be appropriately performed by setting the respective process conditions to the values within respective ranges.

In addition, during the film-forming process, the sub-heater 50 may be controlled to maintain the preset temperature which is equal to or higher than the temperature of the heater 14 or the process chamber 18. The heating by the sub-heater 50 may be stopped if necessary as described above.

Purging and Returning to Atmospheric Pressure Step S206

After the film-forming processing is completed, by opening the valve 28b, the N$_2$ gas is supplied into the process chamber 18 through the gas supply pipe 24b and is exhausted through the exhaust pipe 120. The N$_2$ gas serves as a purge gas. Thus, the inside of the process chamber 18 is purged, and the residual gas inside the process chamber 18 or the reaction by-products are removed from the process chamber 18 (purging). Then, an inner atmosphere of the process chamber 18 is replaced with an inert gas (inner atmosphere substitution) and the inner pressure of the process chamber 18 is restored to a normal pressure (returning to atmospheric pressure).

Boat Unloading and Wafer Discharging Step S207

The lower end of the reaction tube 16 is opened by lowering the seal cap 38 by the boat elevator 46. The processed wafer 2 is unloaded to the outside of the reaction tube 16 through the lower end of the reaction tube 16 while being supported on the boat 20 (boat unloading). The processed wafer 2 is discharged from the boat 20 (wafer discharging).

Figure 5:
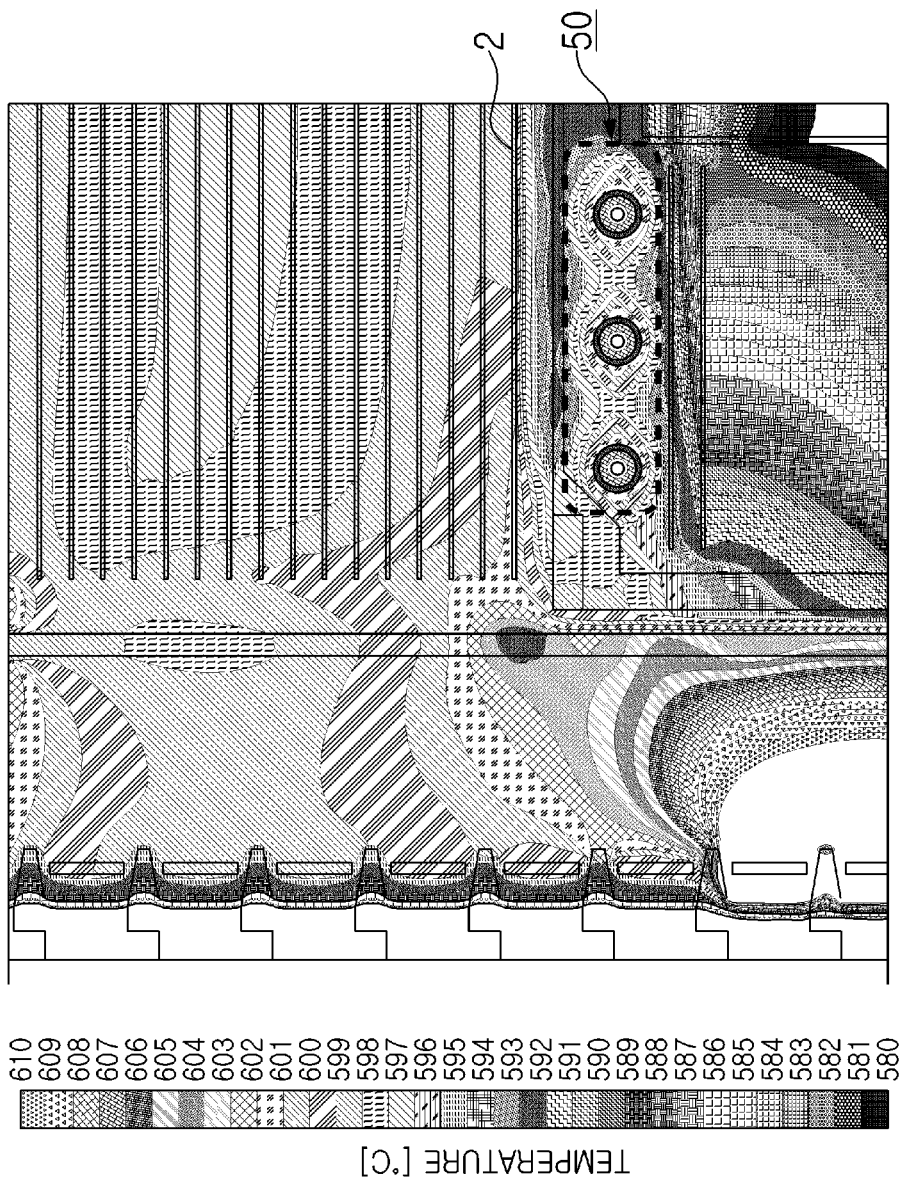
FIG. 5 illustrates a temperature distribution when the entire bottom region is heated by a conventional surface type heater.

Next, heating of the bottom region by a conventional sub-heater (surface type sub-heater) will be described. The conventional sub-heater having a coil with three loops was evaluated. As shown in FIG. 5, when the entire bottom region is heated by the surface type sub-heater, a temperature distribution with a higher temperature at the peripheral portion and a lower temperature at the center portion of the bottom region is obtained. The temperature difference at the surface of the lowermost wafer 2 was about 4° C. at maximum. When the sub-heater that heats the entire bottom region is used, a large temperature difference exists at the surface of the wafer 2. As a result, the uniformity (e.g. the uniformity of the thickness or quality) of the film on the wafer 2 may be degraded or the recovery time may increase.

As a result of extensive research, the inventors of the present application have found that the sub-heater 50 having a structure capable of partially heating the bottom region rather than the surface type heater capable of heating the entire bottom region reduces the temperature difference between the peripheral portion and the center portion of the bottom region. This structure removes the most of the temperature difference and provides smooth temperature distribution at the surface of the wafer.

Based on the foregoing, the inventors have studied the preferable shape of the heating part 84, and found that a structure with a single loop which heats the wafer 2 at a location spaced apart from the center of the wafer 2 in radial direction by $\frac{1}{5}$ to $\frac{3}{5}$, preferably $\frac{3}{10}$ to $\frac{8}{15}$, and more preferably $\frac{2}{5}$ to $\frac{31}{60}$ of the radius of the wafer 2 improves the temperature distribution at the surface of the wafer 2.

Figure 6:
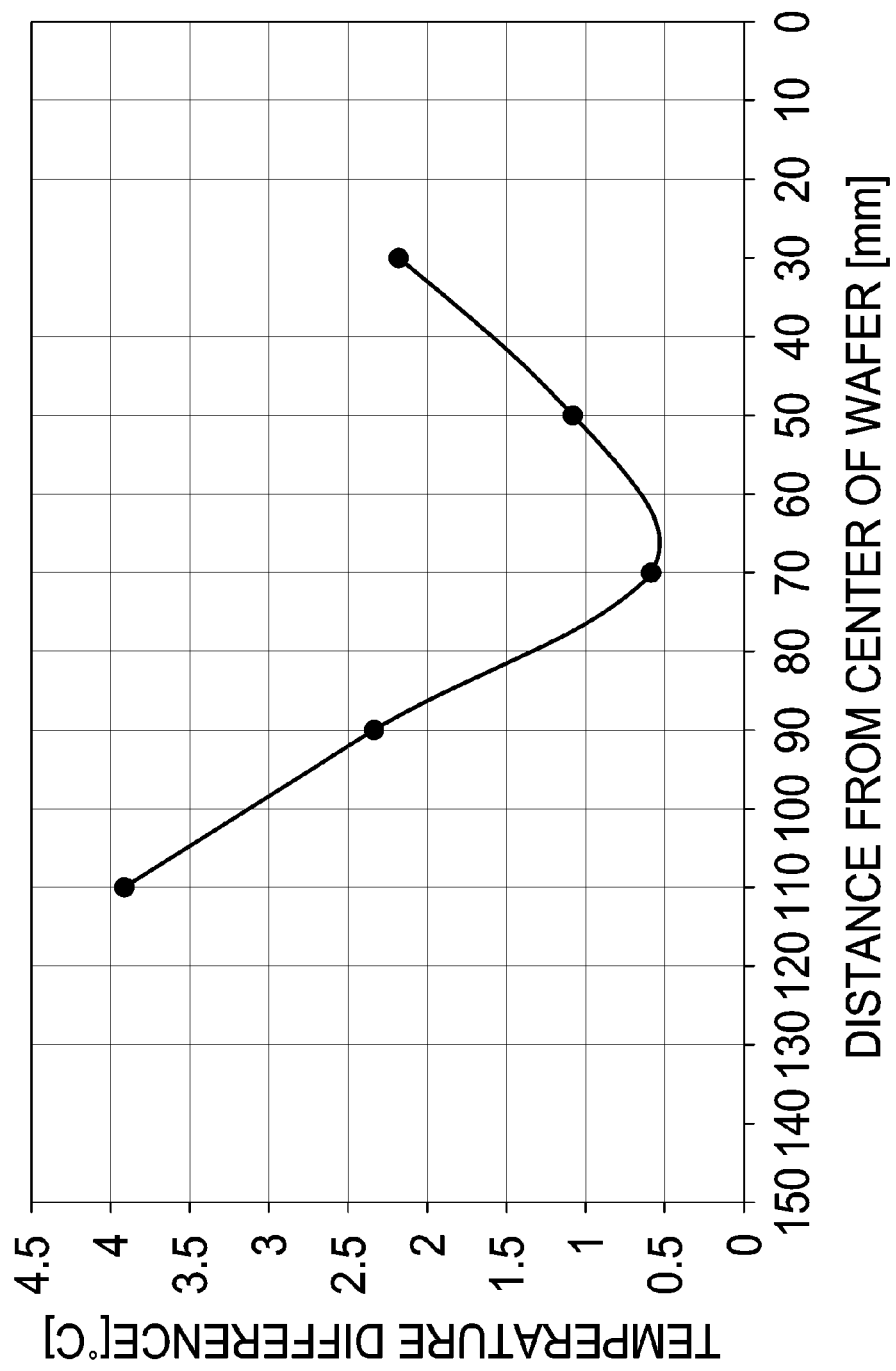
FIG. 6 illustrates a maximum temperature difference at a surface of a lowermost substrate when heated region is varied.
Figure 7:
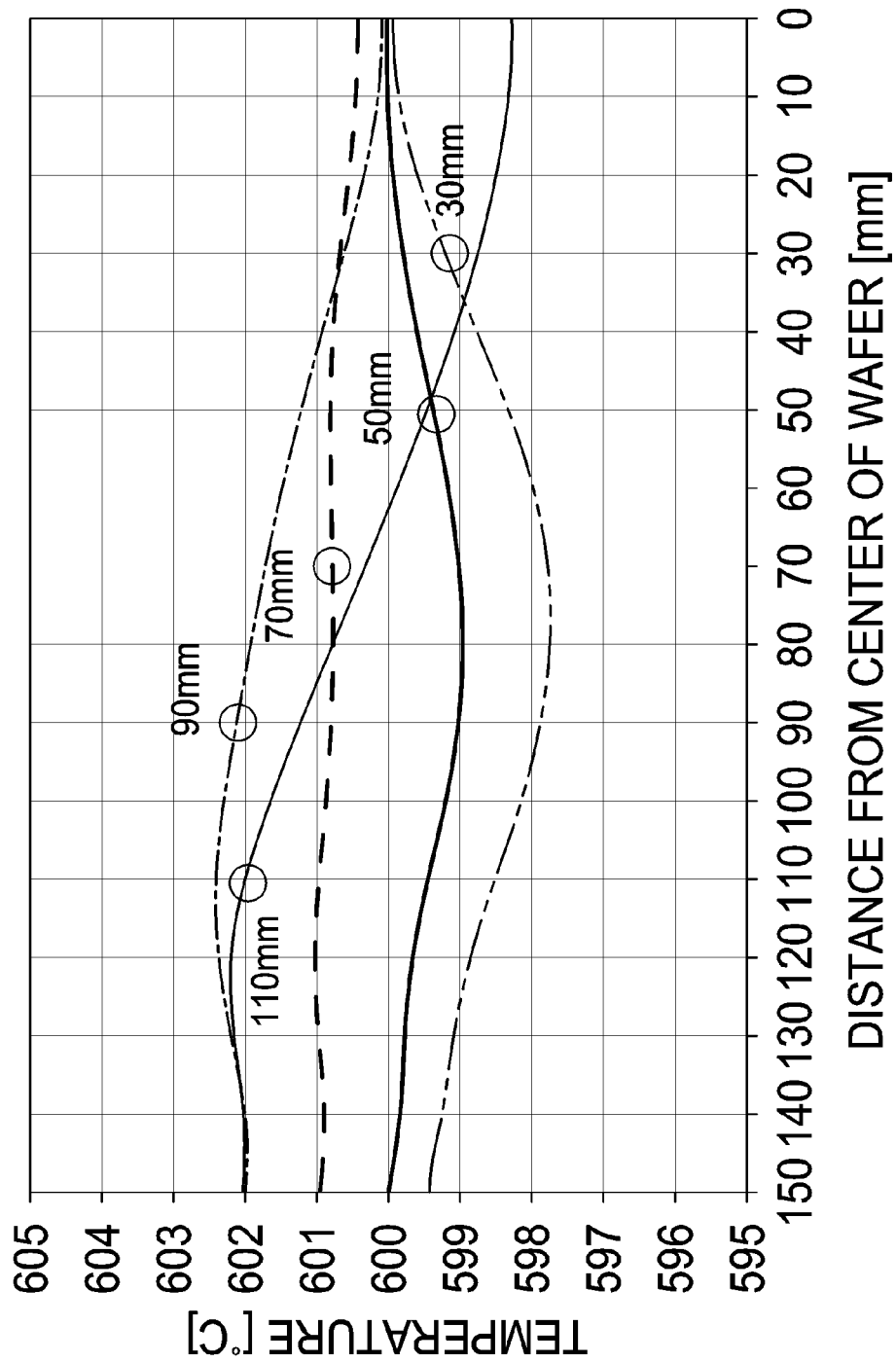
FIG. 7 illustrates a temperature distribution at the surface of the lowermost substrate when heated region is varied.
Figure 8:
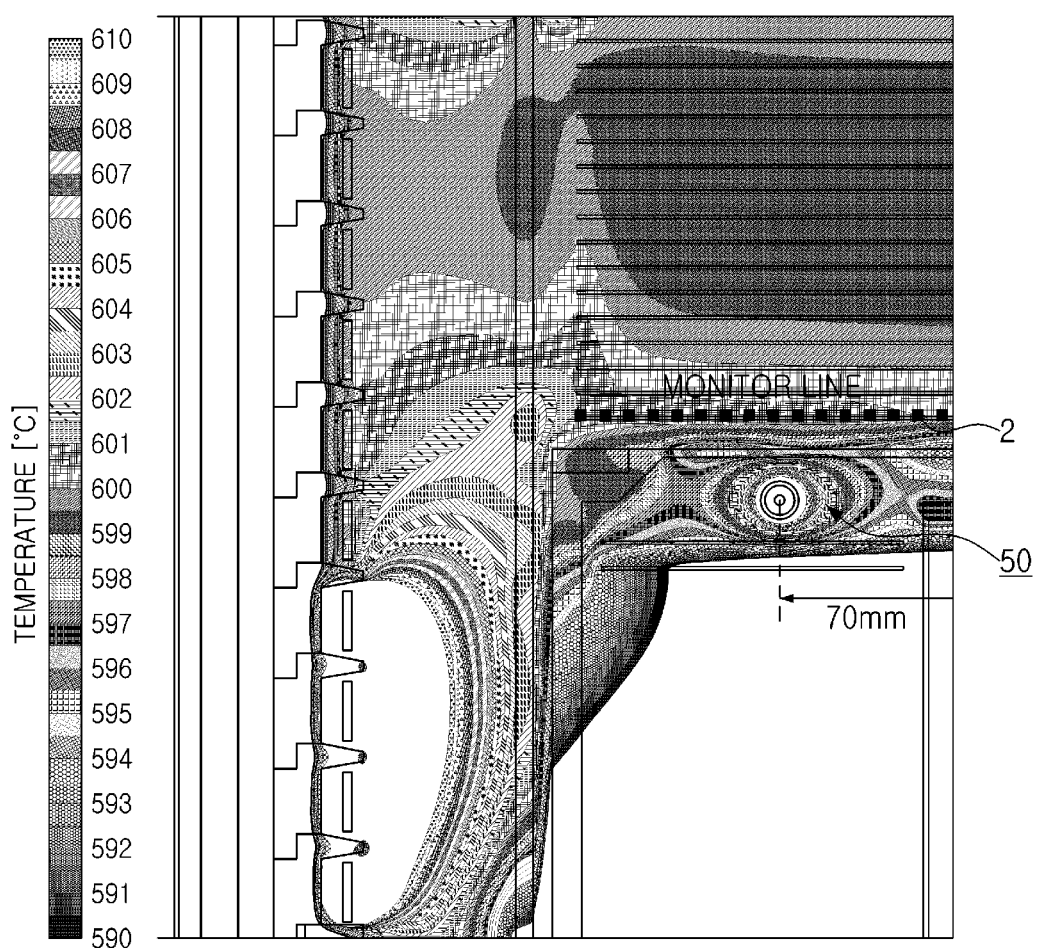
FIG. 8 illustrates a temperature distribution when a substantially mid portion of a radius of a substrate in the bottom region is heated by a sub-heater according to the embodiment.

FIGS. 6 and 7 show the result of evaluating the temperature distribution with respect to the horizontal distance from the center of the wafer 2 to the center of the tube of the annular heating part 48 of the sub-heater 50. In the evaluation, a configuration designed for 300 mm wafers as shown in FIG. 8 is used. As shown in FIG. 6, when the sub-heater 50 heats the wafer 2 at a location spaced apart from the center of the wafer 2 in radial direction by 30 mm to 90 mm, i.e., by $\frac{1}{5}$ to $\frac{3}{5}$ of the radius of the wafer 2, the temperature difference (variation) within the surface of the bottom wafer 2 is equal to or lower than 2.3° C. Therefore, the temperature difference is improved compared to the case where the entire bottom region is heated. On the other hand, when the sub-heater 50 heats the wafer 2 at a radius less than 30 mm or more than 90 mm, the temperature difference is equal to or higher than 2.5° C. As a result, the uniformity of the film is degraded due to the large temperature difference within the surface of the wafer 2.

When the sub-heater 50 heats the wafer 2 at a location spaced apart from the center of the wafer 2 in radial direction by 45 mm to 80 mm, i.e., by $\frac{3}{10}$ to $\frac{8}{15}$ of the radius or heats the mid portion of the radius of the wafer 2 between the center and the outer circumference of the wafer 2 instead of the center portion of the wafer 2, the temperature difference at the surface of the wafer 2 is about 1.3° C. Therefore, the temperature difference at the surface of the wafer 2 is further improved compared to the case where the entire bottom region is heated.

When the sub-heater 50 heats the wafer 2 at a location spaced apart from the center of the wafer 2 in radial direction by 60 mm to 77.5 mm, i.e., by $\frac{2}{5}$ to $\frac{31}{60}$ of the radius or heats the mid portion of the radius of the wafer 2 between the center and the outer circumference of the wafer 2 instead of the center portion of the wafer 2, the temperature difference at the surface of the wafer 2 is about 0.6° C. Therefore, the temperature difference at the surface of the wafer 2 is significantly improved compared to the case where the entire bottom region is heated. When the temperature difference at the surface of the wafer 2 is less than 1° C., the uniformity of the film formed on the surface of the wafer 2 may be further improved.

The temperature distributions for particular diameters are shown in FIG. 7. As shown in FIG. 8, from the interpolation of these evaluation, the optimal radius of the torus-shaped sub-heater 50 is estimated at 67.5 mm, i.e. 45% of the radius of the wafer and, against expectations, it is less than the half of the wafer radius when the diameter of the sub-heater 50 is 155 mm.

FIG. 8 shows a computer-simulated temperature distribution, given that the sub-heater 50 heats the wafer 2 at a location spaced apart from the center of the wafer 2 in radial direction by 70 mm. A flat temperature distribution sufficient to process the wafer 2 is obtained, thereby improving the temperature distribution compared to the case of using the conventional sub-heater. In the case of FIG. 8, the insulating unit 190 has a casing comprising a cylindrical wall and a ceiling and the sub-heater 50 is placed inside the casing. The casing may be made from transparent artificial quartz. These configurations enable the heat insulating unit to purge inside with inert gases so as to isolate inside from outside and avoid adhesion of process gases or by-product to the sub-heater 50, that causes non-uniformity of temperature.

According to the above-described evaluation results, the temperature distribution at the surface of the wafer 2 is improved when the radius of the annular heating part 84 which partially heats the bottom region is $1/5$ to $3/5$, preferably $3/10$ to $8/15$, and more preferably $2/5$ to $31/60$ of the radius of the wafer 2. According to the embodiment, the radius of the annular heating part 84 refers to the radius of the circle 148 which is formed by connecting the centers of lines perpendicularly connecting the inner circumference and the outer circumference of the heating part 84. That is, the heating part 84 heats the portion of the wafer 2 along the circle 148.

Figure 10:
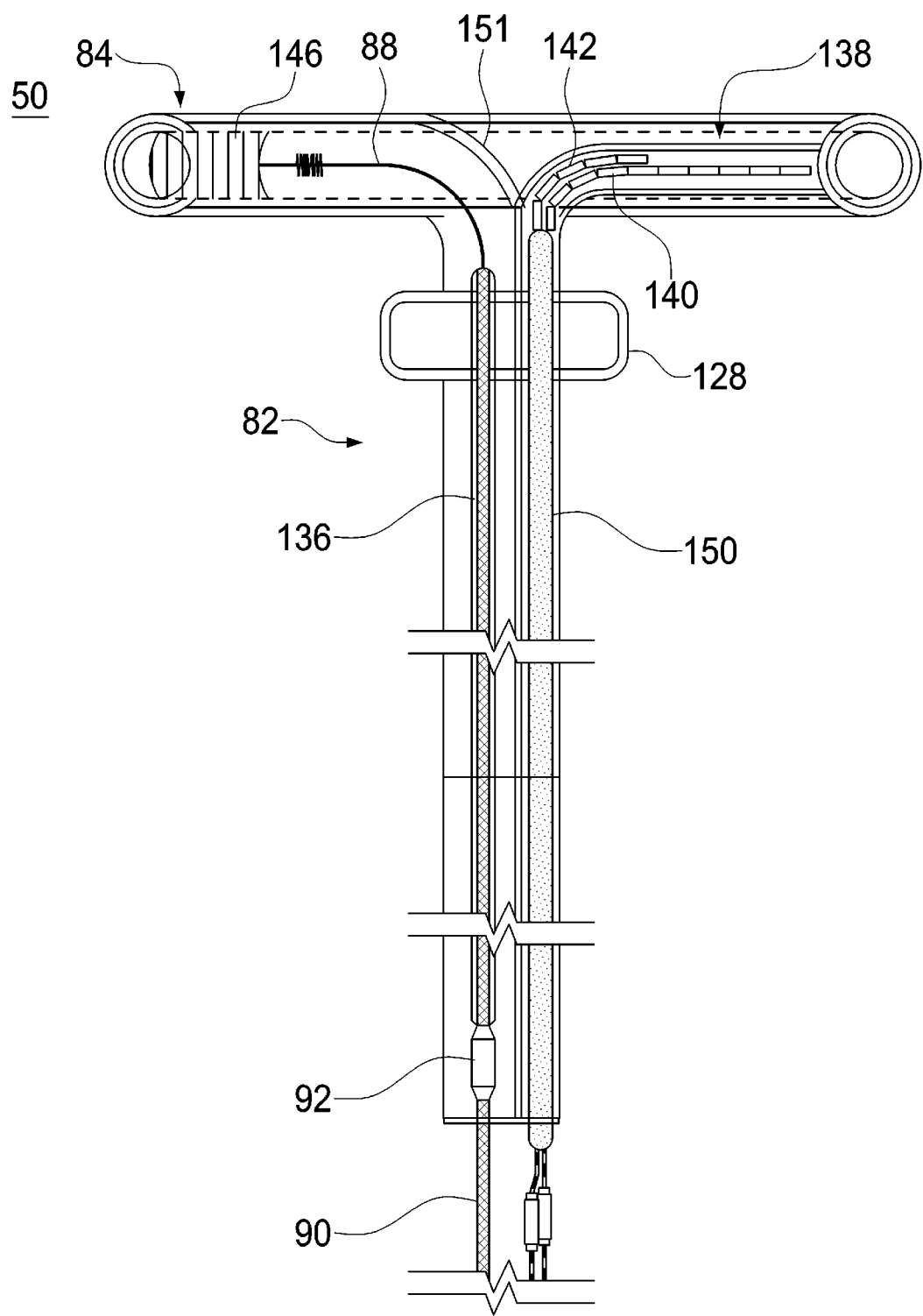
FIG. 10 is a vertical cross-sectional view of the sub-heater of the substrate processing apparatus according to the embodiment.
Figure 11:
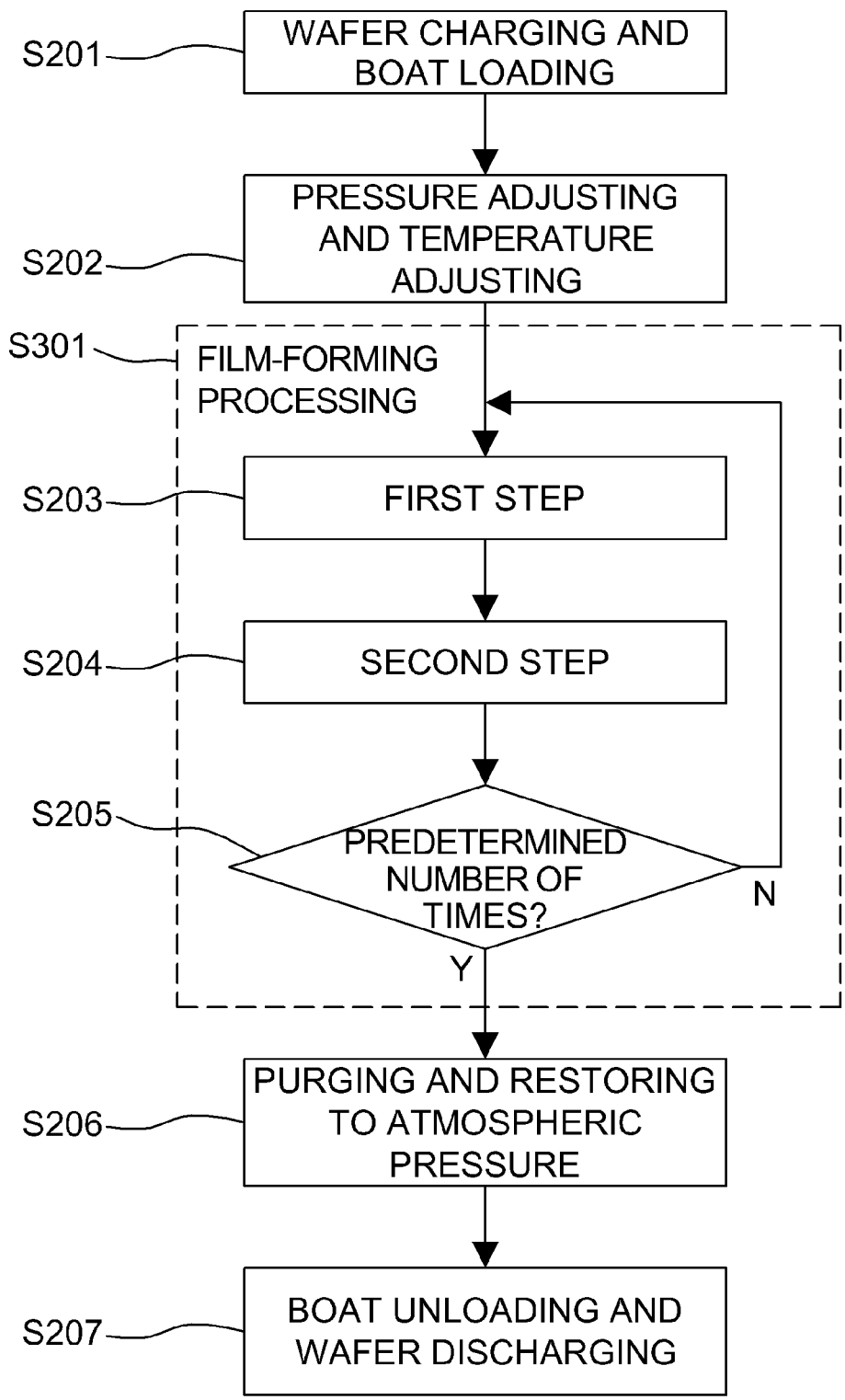
FIG. 11 is a flowchart illustrating a method of manufacturing a semiconductor device according to the embodiment.

Next, the configuration of the sub-heater 50 according to the embodiment will be described in detail. As shown in FIGS. 9 and 10, the pillar 82 is vertically arranged and is connected to the center of the heating part 84 to support the heating part 84 from thereunder. An expanding part 128 is provided at the top of the pillar 82. The area of the horizontal cross-section of the expanding part 128 is greater than the area of the horizontal cross-section of the pillar 82. The heating part 84 is connected to the upper surface of the expanding part 128. The diameter of the expanding part 128 is larger than the diameter of the pillar 82. Both ends of the tube member constituting the heating part 84 are connected to the upper surface of the expanding part 128. The area of the horizontal cross-section of the expanding part 128 is at least twice the area of the vertical cross-section of the heating part 84. That is, when using a circular tube, the diameter of the expanding part 128 is at least twice the diameter of the circular tube of the heating part 84. The heating part 84 may be connected to the upper surface of the expanding part 128 while maintaining the shape of the circular tube to secure the connection strength.

The annular heating part 84 is connected to the upper surface of the expanding part 128. The heating part 84 includes a resistive heating element 146, a connecting part 134 and an annular member 130. The annular member 130 is an arc shape along the circle 148 having a predetermined diameter. The connecting part 134 is a tubular member that connects the end of the annular member 130 to the upper surface of the expanding part 128. That is, the connecting part 134 extends vertically from the upper surface of the expanding part 128 and then is bent horizontally to be connected to the end portion of the annular member 130. Specifically, the connecting part 134 includes: a curved portion 132 having a first end portion connected to the end portion of the annular member 130; a straight portion 152 extending parallel to a center line of the circle 148 and having a first end portion connected to a second end portion of the curved portion 132; and a bent portion 151 having a first end portion connected to a second end portion of the straight portion 152 and a second end portion bent downward and connected to the upper surface of the expanding part 128. A pair of connecting parts 134 is provided symmetrically with predetermined intervals therebetween. That is, the heating part 84 symmetric with respect to the center line.

The heating part 84 includes a coiled resistive heating element 146 having the boundary between the curved portion 132 and the straight portion 152 as a starting point of heating and accommodated in the in the annular member 130. By applying electric power to the resistive heating element 146, the sub-heater 50 generates substantially uniform heat in annular form. The resistive heating element 146 is made of a material such as Fe—Cr—Al alloy and molybdenum disilicide. The resistive heating element 146 inserted into the annular member 130 at the starting point of heating is connected to a lead wire 88 (also referred to as a bare copper wire). The lead wire 88 is bent at the upper side of the expanding part 128 into the pillar 82, and is insulated by an insulating pipe 136 which is made of a material such as alumina and ceramic. The insulating pipe 136 may be one long pipe or a plurality of short pipes. A pair of power supply wiring 90 is connected, by crimping, to the end portions of a pair of lead wires 88 at the bottom of pillar 82 by joint 92, respectively. The power supply wiring 90 is a conventional insulated wire, which is drawn out from the lower end of the pillar 82 and connected to a power source (not shown). The lower end of the pillar 82 need not be completely sealed in air-tight manner. Preferably, a cover (not shown) may be provided at the lower end of the pillar 82 to prevent free entry and exit of the outside atmosphere. That is, the inner atmosphere of the pillar 82 may be air at atmospheric pressure.

The starting point of heating of the resistive heating element 146 is disposed at the boundary between the curved portion 132 and the straight portion 152 since the length of the resistive heating element 146 is longer than the circumference of the circle 148. Therefore, the heat loss occurring in the space near the curved portion 132 may be compensated.

The sub-heater 50 may further include a temperature detecting unit 138. The temperature detecting unit 138, which detects the temperatures of the bottom region and the sub-heater 50, is inserted into the pillar 82 of the sub-heater 50. The temperature detecting unit 138 is bent to have a substantially L-shaped cross-section. A pair of temperature sensors 140 and 142 is sealed inside the temperature detecting unit 138. The temperature detecting unit 138 is attached to the outer wall of the annular member 130 by bending horizontally at the center of the annular portion above the expanding part 128 in a direction opposite to the connecting part 134. The horizontal portion of the temperature detecting unit 138 is parallel to the heating part 84. The temperature detecting unit 138 includes a tubular member. The height at which the horizontal portion of the temperature detecting unit 138 is positioned is substantially the same as the height at which the annular member 130 is positioned. Since the temperature detecting unit 138 is welded to the outer wall of the annular member 130, the sub-heater 50 is reinforced without providing other reinforcing members.

The temperature sensor 140 is installed near the outer wall of the annular member 130 and detects the temperature of the sub-heater 50. The temperature sensor 142 is installed near the center of the annular member 130 and detects the temperature of the space surrounded by the heating part 84, i.e. the temperature of the center portion of the heating part 84. According to the embodiment, the temperature sensor 142 is installed in the vicinity of the outer wall of the expanding part 128 when viewed from above. The controller 210 determines whether the resistive heating element 146 is operational based on the temperature detected by the temperature sensor 142. The temperature sensors 140 and 142 are inserted into a single protective pipe and each of the temperature sensors 140 and 142 is covered by an insulating pipe within the protective pipe. The insulating pipe is made of a material such as alumina.

According to the embodiment, one or more advantageous effects are provided as described below.

(a) By providing the sub-heater directly under the lowermost wafer, the time required to raise the temperature of the low temperature portion of the lowermost wafer may be shortened to reduce the recovery time.

(b) The structure wherein only the boat is rotated without rotating the sub-heater and the insulation unit support suppresses the generation of particles in the sub-heater and the insulating unit support, thereby improving the productivity. Since only the boat rotates, the heating deviation of the wafer due to the sub-heater may be suppressed, resulting in uniform heating of the wafer.

(c) By installing an insulating unit with a small heat capacity below the sub-heater, the leakage of heat from the sub-heater to the region where the insulating unit is installed may be prevented, thereby reducing the time necessary to raise the temperatures of the sub-heater and the lowermost wafer.

(d) By providing the expanding part on top of the pillar, the diameter of the pillar may be equal to that of the heating part or less than ½ of the diameter of the expanding part. As a result, the width of the notch of the second heat insulating plate may be reduced, and the influence of heat on the furnace opening may be suppressed.

(e) The temperature detecting unit, which detects the temperature of the sub-heater, is inserted into the sub-heater to reduce the cost for manufacturing compared to installing the temperature detecting unit separately.

(f) Since the whole body of the sub-heater is fabricated by bending or welding the round quartz pipe, the structure that withstands the pressure difference may be achieved at a low cost.

(g) The difference between the temperatures at the peripheral portion and the center of the process chamber of the bottom region of the process chamber is reduced by heating the mid portion of the radius of the wafer 2 between the center and the outer circumference of the wafer 2 instead of the center portion of the wafer 2. Thus, the bottom region may be efficiently heated and the uniformity of the temperature at the surface of the wafer may be improved.

While the coiled resistive heating element is described above as an example of a heating element, a lamp heater such as a halogen lamp may be used as the heating element.

Other Embodiments

The embodiment has been described in detail. However, the above-described techniques are not limited to the above-described embodiment. The techniques described herein may be variously modified without departing from the gist thereof.

While the HCDS gas is exemplified as the source gas in the above-described embodiment, the above-described technique is not limited thereto. For example, gases such as an inorganic halosilane source gas and an amino-based (amine-based) silane source gas free of halogen may be used as the source gas instead of the HCDS gas. The inorganic halosilane source gas may include monochlorosilane ($SiH_3Cl$, abbreviated as MCS) gas, dichlorosilane ($SiH_2Cl_2$, abbreviated as DCS) gas, trichlorosilane (($SiHCl_3$, abbreviated as TCS) gas, tetrachlorosilane (i.e., silicon tetrachloride, $SiCl_4$, abbreviated as STC) gas and octachlorotrisilane ($Si_3Cl_8$, abbreviated as OCTS) gas. The amino-based (amine-based) silane source gas free of halogen may include tris dimethylaminosilane ($Si[N(CH_3)_2]_3H$, abbreviated as 3DMAS) gas, tetrakis dimethylaminosilane ($Si[N(CH_3)_2]_4$, abbreviated as 4DMAS) gas, bisdiethylaminosilane ($Si[N(C_2H_5)_2]_2H_2$, abbreviated as BDEAS) gas and bistertiary butyl aminosilane ($SiH_2[NH(C_4H_9)]_2$, abbreviated as BTBAS) gas. The inorganic halosilane source gas free of halogen such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

While the $NH_3$ gas is exemplified as the reactive gas in the above-described embodiment, the above-described technique is not limited thereto. For example, hydrogen nitrate-based gases such as diazene ($N_2H_2$) gas, hydrazine ($N_2H_4$) gas, $N_3H_8$ gas and compounds thereof may be used as the reactive gas as well as the $NH_3$ gas. For example, gases such as an ethylamine-based gas and a methylamine-based gas may be used as the reactive gas. The ethylamine-based gas may include triethylamine (($C_2H_5$)$_3$N, abbreviated as TEA) gas, diethylamine (($C_2H_5$)$_2$NH, abbreviated as DEA) gas and monoethylamine ($C_2H_5NH_2$, abbreviated as MEA) gas. The methylamine-based gas may include trimethylamine (($CH_3$)$_3$N, abbreviated as TMA) gas, dimethylamine (($CH_3$)$_2$NH, abbreviated as DMA) gas and monomethylamine ($CH_3NH$, abbreviated as MMA) gas. An organic hydrazine-based gas such as trimethylhydrazine (($CH_3$)$_2N_2(CH_3)H$, abbreviated as TMH) gas may also be used as the source gas.

While the HCDS gas is exemplified as the source gas and a nitrogen (N)-containing gas such as the $NH_3$ gas is exemplified as the reactive gas in the above-described embodiment, the above-described technique is not limited thereto. For example, the above-described techniques may be applied to the formations of SiO film, SiON film, SiOCN film, SiOC film, SiCN film, SiBN film and SiBCN film according to the film-forming sequence described above by using an oxygen-containing gas such as an oxygen ($O_2$) gas, a carbon-containing gas such as a propylene ($C_3H_6$) gas and a boron-containing gas such as boron trichloride ($BCl_3$) instead of or in addition to the gases described above, In addition, the order of supplying gases may be changed appropriately. These films may be formed under substantially the same processing condition as the above-described embodiment. This modified example provides substantially the same advantageous effects as those of the above-described embodiment.

$$(3DMAS \rightarrow O_3) \times n \Rightarrow SiO$$

$$(HCDS \rightarrow NH_3 \rightarrow O_2) \times n \Rightarrow SiON$$

$$(HCDS \rightarrow C_3H_6 \rightarrow O_2 \rightarrow NH_3) \times n \Rightarrow SiOCN$$

(HCDS→TEA→$O_2$)×n=>SiOC (HCDS→$C_3H_6$→$NH_3$)×n=>SiCN (HCDS→$BCl_3$→$NH_3$)×n=>SiBN (HCDS→$C_3H_6$→$BCl_3$→$NH_3$)×n=>SiBCN

While the embodiments have been described by way of an example in which a silicon-based insulating film such as an SiN film is formed. However, the above-described technique is not limited thereto. For example, the above-described technique may be preferably applied to a formation of a metal-based film, that is a film including a metal element such as titanium (Ti), zirconium (Zr), hafnium (Hf), tantalum (Ta), niobium (Nb), aluminum (Al), molybdenum (Mo), and tungsten (W) on the wafer 2.

For example, the above-described technique may be preferably applied to form film on the wafer 2 such as TiN film, TiO film, TiON film, TiOCN film, TiOC film, TiCN film, TiBN film, TiBCN film, ZrN film, ZrO film, ZrON film, ZrOCN film, ZrOC film, ZrCN film, ZrBN film, ZrBCN film, HfN film, HfO film, HfON film, HfOCN film, HfOC film, HfCN film, HfBN film, HfBCN film, TaN film, TaO film, TaON film, TaOCN film, TaOC film, TaCN film, TaBN film, TaBCN film, NbN film, NbO film, NbON film, NbOCN film, NbOC film, NbCN film, NbBN film, NbBCN film, AlN film, AlO film, AlON film, AlOCN film, AlOC film, AlCN film, AlBN film, AlBCN film, MoN film, MoO film, MoON film, MoOCN film, MoOC film, MoCN film, MoBN film, MoBCN film, WN film, WO film, WON film, WOCN film, WOC film, WCN film, WBN film and WBCN film. In addition, the above-described technique may be preferably applied to form a doped film by doping one of the films above with an element such as a TiAlN film, a TiAlC film, a TiSiN film and a TiSiC film.

In case of forming the metal-based film, an inorganic metal source gas containing a metal element and a halogen element may be used as the source gas. The inorganic metal source gas containing the metal element and the halogen element may include a gas such as a titanium tetrachloride ($TiCl_4$) gas, titanium tetrafluoride ($TiF_4$) gas, zirconium tetrachloride ($ZrCl_4$) gas, zirconium tetrafluoride ($ZrF_4$) gas, hafnium tetrachloride ($HfCl_4$) gas, hafnium tetrafluoride ($HfF_4$) gas, tantalum pentachloride ($TaCl_5$) gas, tantalum pentafluoride ($TaF_5$) gas, niobium pentachloride ($NbCl_5$) gas, niobium pentafluoride ($NbF_5$) gas, aluminum trichloride ($AlCl_3$) gas, aluminum trifluoride ($AlF_3$) gas, molybdenum pentachloride ($MoCl_5$) gas, molybdenum pentafluoride ($MoF_5$) gas, tungsten hexachloride ($WCl_6$) gas and tungsten hexafluoride ($WF_6$) gas. For example, organic metal source gas such as trimethyl aluminum ($Al(CH_3)_3$, abbreviated as TMA) containing the metal element and carbon may be used as the source gas. As the reactive gas, the gases used in the above-described embodiment may be used.

For example, film such as TiN film, TiO film, TiON film, TiCN film, TiAlC film, TiAlN film and TiSiN film may be formed on the wafer 2 according to film-forming sequences below.

($TiCl_4$→$NH_3$)×n=>TiN ($TiCl_4$→$O_2$)×n=>TiO ($TiCl_4$→$NH_3$→$O_2$)×n=>TiON ($TiCl_4$→$C_3H_6$→$NH_3$)×n=>TiCN ($TiCl_4$→TMA)×n=>TiAlC ($TiCl_4$→TMA→$NH_3$)×n=>TiAlN ($TiCl_4$→HCDS→$NH_3$)×n=>TiSiN

The order of supplying gases may be changed appropriately. The exemplary films described above may be formed under substantially the same processing conditions as the above-described embodiment. This modified example provides substantially the same advantageous effects as those of the above-described embodiment.

That is, the above-described technique may be preferably applied to a formation of a film containing a predetermined element such as a semiconductor element and a metal element.

While the embodiment is described by way of an example in which the film is deposited on the wafer 2, the above-described technique is not limited thereto. The above-described technique may be applied to the processes such as an oxidation process, a diffusion process, an annealing process and an etching process of the wafer 2 or the film formed on the wafer 2.

The above-described embodiments and modifications may be appropriately combined. The processing conditions of the combinations may be substantially the same as the above-described embodiment or modification.

According to the technique described herein, the time necessary for stabilizing the inner temperature of the processing furnace may be reduced.

What is claimed is:

1. A substrate processing apparatus comprising:
   a wafer retainer configured to support a plurality of wafers;
   an upright cylindrical process vessel where the plurality of wafers supported by the wafer retainer is processed;
   a seal cap configured to cover an opening at a lower end of the process vessel;
   a first heater configured to heat an inside of the process vessel from a lateral side thereof;
   an insulating unit disposed between the seal cap and the wafer retainer in the process vessel; and
   a second heater facing at least one of the plurality of wafers supported by the wafer retainer disposed above the insulating unit, wherein the second heater is configured to heat the at least one of the plurality of wafers, the second heater comprising: a pillar penetrating centers of the seal cap and the insulating unit; an annular member made of a tubular member connected to and concentric with the pillar; a pair of connecting parts connecting end portions of the annular member to the pillar; and a heating element disposed inside the annular member,
   wherein the second heater further comprises an expanding part disposed on an upper end of the pillar, the expanding part having a diameter greater than a diameter of the pillar and at least twice larger than a diameter of the tubular member.

2. The substrate processing apparatus of claim 1, wherein each of: the pillar, the annular member, and the connecting part comprises the tubular member made of a same material.

3. A substrate processing apparatus comprising:
   a wafer retainer configured to support a plurality of wafers;
   an upright cylindrical process vessel where the plurality of wafers supported by the wafer retainer is processed;
   a seal cap configured to cover an opening at a lower end of the process vessel;

a first heater configured to heat an inside of the process vessel from a lateral side thereof;

an insulating unit disposed between the seal cap and the wafer retainer in the process vessel; and a second heater facing at least one of the plurality of wafers supported by the wafer retainer disposed above the insulating unit, wherein the second heater is configured to heat the at least one of the plurality of wafers, the second heater comprising: a pillar penetrating centers of the seal cap and the insulating unit an annular member connected to and concentric with the pillar; a pair of connecting parts connecting end portions of the annular member to the pillar; and a heating element disposed inside the annular member, wherein the annular member is parallel to a lowermost wafer of the plurality of wafers, and a radius of the annular member is ⅕ to ⅗ of a radius of the lowermost wafer.

4. The substrate processing apparatus of claim 2, wherein the connecting part comprises: a curved portion connected to an end portion of the annular member; a straight portion connected to the curved portion and extending horizontally toward an outer circumference of the annular member; and a bent portion connected to the straight portion and bent downward to be connected to an upper surface of the expanding part.

5. The substrate processing apparatus of claim 4, wherein the heating element includes a coiled resistive wire and is longer than a circumference of a circle having a diameter the same as that of the annular member, and the second heater further comprises a pair of lead wire configured to supply electric power to the heating element, wherein each of the pair of lead wires is inserted in the pillar and the straight portion and insulated by an insulating pipe.

6. The substrate processing apparatus of claim 4, further comprising a temperature detecting unit provided to penetrate the pillar, wherein the temperature detecting unit is bent horizontally at a center of the annular portion in a direction opposite to the connecting part to be connected to an outer wall of the annular member.

7. The substrate processing apparatus of claim 6, wherein the temperature detecting unit comprises a first temperature sensor configured to detect a temperature of the second heater; and a second temperature sensor configured to detect a temperature of a center portion of the annular member.

8. The substrate processing apparatus of claim 3, further comprising: a rotatable cylindrical base penetrating the insulating unit and configured to support the wafer retainer, wherein the pillar penetrates the base and is unrotatable.

9. The substrate processing apparatus of claim 3, further comprising a disc-shaped first insulating plate disposed below the second heater and having a diameter substantially same as a diameter of the lowermost wafer, and the insulating unit comprises a second insulating plate disposed below the first insulating plate and having an emissivity lower than an emissivity of the first insulating plate.

10. The substrate processing apparatus of claim 9, wherein a heat capacity of the second insulating plate is smaller than that of the first insulating plate.

11. The substrate processing apparatus of claim 8, further comprising a rotating mechanism disposed below the seal cap and configured to rotate the wafer retainer via the base, the rotating mechanism comprising: a fixed inner shaft configured to support the second heater; and a rotatable outer shaft disposed concentric with the inner shaft and configured to support the base.

12. The substrate processing apparatus of claim 10, wherein a diameter of the second insulating plate is smaller than that of the first insulating plate.

13. The substrate processing apparatus of claim 11, wherein each of the inner shaft and the base comprises a through-hole penetrated by the pillar of the second heater.

14. The substrate processing apparatus of claim 1, further comprising: a control unit configured to control the second heater to suspend heating of the plurality of wafers.

\* \* \* \* \*